US008929568B2

(12) United States Patent
Grancharov et al.

(10) Patent No.: US 8,929,568 B2
(45) Date of Patent: Jan. 6, 2015

(54) BANDWIDTH EXTENSION OF A LOW BAND AUDIO SIGNAL

(75) Inventors: Volodya Grancharov, Solna (SE); Stefan Bruhn, Sollentuna (SE); Harald Pobloth, Täby (SE); Sigurdur Sverrisson, Kungsängen (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 401 days.

(21) Appl. No.: 13/509,859

(22) PCT Filed: Sep. 14, 2010

(86) PCT No.: PCT/SE2010/050984

§ 371 (c)(1),
(2), (4) Date: May 15, 2012

(87) PCT Pub. No.: WO2011/062538

PCT Pub. Date: May 26, 2011

(65) Prior Publication Data

US 2012/0230515 A1 Sep. 13, 2012

Related U.S. Application Data

(60) Provisional application No. 61/262,593, filed on Nov. 19, 2009.

(51) Int. Cl.
*H03G 5/00* (2006.01)
*G10L 21/038* (2013.01)

(52) U.S. Cl.
CPC .................................... *G10L 21/038* (2013.01)
USPC ............................................................ 381/98

(58) Field of Classification Search
CPC ......... H04R 3/04; H03G 5/165; H03G 5/025; H03G 5/005; H04S 7/307
USPC ........................................................... 381/98
See application file for complete search history.

(56) References Cited

U.S. PATENT DOCUMENTS 7,205,910 B2 * 4/2007 Honma et al. .................. 341/50
2004/0002856 A1 1/2004 Bhaskar et al.
2004/0078194 A1 4/2004 Liljeryd et al.

(Continued)

FOREIGN PATENT DOCUMENTS

EP 0 732 687 A2 9/1996
EP 1 300 833 A2 4/2003
EP 1 638 083 A1 3/2006

OTHER PUBLICATIONS

International Search Report, PCT/SE2010/050984, Mar. 4, 2011.

(Continued)

*Primary Examiner* — Simon Sing
(74) *Attorney, Agent, or Firm* — Myers Bigel Sibley & Sajovec, P.A

(57) ABSTRACT

Estimation of a high band extension of a low band audio signal includes the following steps: extracting (S1) a set of features of the low band audio signal; mapping (S2) extracted features to at least one high band parameter with generalized additive modeling; frequency shifting (S3) a copy of the low band audio signal into the high band; controlling (S4) the envelope of the frequency shifted copy of the low band audio signal by said at least one high band parameter.

17 Claims, 12 Drawing Sheets

(56) References Cited

U.S. PATENT DOCUMENTS

| | | | | |
|---|---|---|---|---|
| 2006/0277038 | A1* | 12/2006 | Vos et al. | 704/219 |
| 2006/0277039 | A1 | 12/2006 | Vos et al. | |
| 2007/0067163 | A1 | 3/2007 | Kabal et al. | |
| 2007/0078646 | A1* | 4/2007 | Lei et al. | 704/200.1 |
| 2007/0208557 | A1* | 9/2007 | Li et al. | 704/200.1 |
| 2008/0260048 | A1* | 10/2008 | Oomen et al. | 375/241 |
| 2009/0144062 | A1 | 6/2009 | Ramabadran et al. | |
| 2012/0065983 | A1* | 3/2012 | Ekstrand et al. | 704/500 |

OTHER PUBLICATIONS

Written Opinion of the International Searching Authority, PCT/SE2010/050984, Mar. 4, 2011.

Written Opinion of the International Preliminary Examining Authority, PCT/SE2010/050984, Dec. 19, 2011.

International Preliminary Report on Patentability, PCT/SE2010/050983, Feb. 16, 2012.

Taylan et al., New Approaches to Regression by Generalized Additive Models and Continuous Optimization for Modern Applications in Finance, Science and Technology:, In: The Art of Scientific Computing, 2nd edition, reprinted 2003, [Retrieved on Feb. 28, 2011], Retrieved from the Internet: ,URL: http://www3.iam.metu.edu.tr/iam/images/9/97/pt-gww-ab-newregression.pdf., abstract, sections 1.3,2, 25 pp.

European Search Report Corresponding to European Patent Application No. 10831867; Dated: Jun. 6, 2013; 5 Pages.

Hastie et al. "Generalized Additive Models", *Statistical Science*, 1986, vol. 1, No. 3, 297-318.

* cited by examiner

LINEAR MODEL

ADDITIVE MODEL

GENERALIZED ADDITIVE MODEL

BANDWIDTH EXTENSION OF A LOW BAND AUDIO SIGNAL

CROSS REFERENCE TO RELATED APPLICATIONS

This application is a 35 U.S.C. §371 national stage application of PCT International Application No. PCT/SE2010/050984, filed on 14 Sep. 2010, which itself claims priority to U.S. provisional Patent Application No. 61/262,593, filed 19 Nov. 2009, the disclosure and content of both of which are incorporated by reference herein in their entirety. The above-referenced PCT International Application was published in the English language as International Publication No. WO 2011/062538 A9 on 26 May 2011.

TECHNICAL FIELD

The present invention relates to audio coding and in particular to bandwidth extension of a low band audio signal.

BACKGROUND

The present invention relates to bandwidth extension (BWE) of audio signals. BWE schemes are increasingly used in speech and audio coding/decoding to improve the perceived quality at a given bitrate. The main idea behind BWE is that part of an audio signal is not transmitted, but reconstructed (estimated) at the decoder from the received signal components.

Thus, in a BWE scheme a part of the signal spectrum is reconstructed in the decoder. The reconstruction is performed using certain features of the signal spectrum that has actually been transmitted using traditional coding methods. Typically the signal high band (HB) is reconstructed from certain low band (LB) audio signal features.

Dependencies between LB features and HB signal characteristics are often modeled by Gaussian mixture models (GMM) or hidden Markov models (HMM), e.g., [1-2]. The most often predicted HB characteristics are related to spectral and/or temporal envelopes.

There are two major types of BWE approaches:

In a first approach, HB signal characteristics are entirely predicted from certain LB features. These BWE solutions introduce artifacts in the reconstructed HB, which in some cases lead to decreased quality in comparison to the band-limited signal. The sophisticated mappings (e.g., based on GMM or HMM) easily lead to degradation with unknown data. The general experience is that the more complex the mapping (large number of training parameters), the more likely artifacts will occur with data types not present in the training set. It is not trivial to find a mapping with complexity that will give an optimal balance between overall prediction accuracy and low number of outliers (data that deviate markedly from data in the training set, i.e. components which can not be very well modeled).

A second approach (an example is described in [3]) is to reconstruct the HB signal from a combination of LB features and a small amount of transmitted HB information. BWE schemes with transmitted HB information tend to improve the performance (at the cost of an increased bit-budget), but do not offer a general scheme to combine transmitted and predicted parameters. Typically one set of HB parameters are transmitted and another set of HB parameters are predicted, which means that transmitted information cannot compensate for failures in predicted parameters.

SUMMARY

An object of the present invention is to achieve an improved BWE scheme.

This object is achieved in accordance with the attached claims.

According to a first aspect the present invention involves a method of estimating a high band extension of a low band audio signal. This method includes the following steps. A set of features of the low band audio signal is extracted. Extracted features are mapped to at least one high band parameter with generalized additive modeling. A copy of the low band audio signal is frequency shifted into the high band. The envelope of the frequency shifted copy of the low band audio signal is controlled by the at least one high band parameter.

According to a second aspect the present invention involves an apparatus for estimating a high band extension of a low band audio signal. A feature extraction block is configured to extract a set of features of the low band audio signal. A mapping block includes the following elements: a generalized additive model mapper configured to map extracted features to at least one high band parameter with generalized additive modeling; a frequency shifter configured to frequency shift a copy of the low band audio signal into the high band; an envelope controller configured to control the envelope of the frequency shifted copy by said at least one high band parameter.

According to a third aspect the present invention involves a speech decoder including an apparatus in accordance with the second aspect.

According to a fourth aspect the present invention involves a network node including a speech decoder in accordance with the third aspect.

An advantage of the proposed BWE scheme is that it offers a good balance between complex mapping schemes (good average performance, but heavy outliers) and more constrained mapping scheme (lower average performance, but more robust).

BRIEF DESCRIPTION OF THE DRAWINGS

The invention, together with further objects and advantages thereof, may best be understood by making reference to the following description taken together with the accompanying drawings, in which.

DETAILED DESCRIPTION

Figure 1:
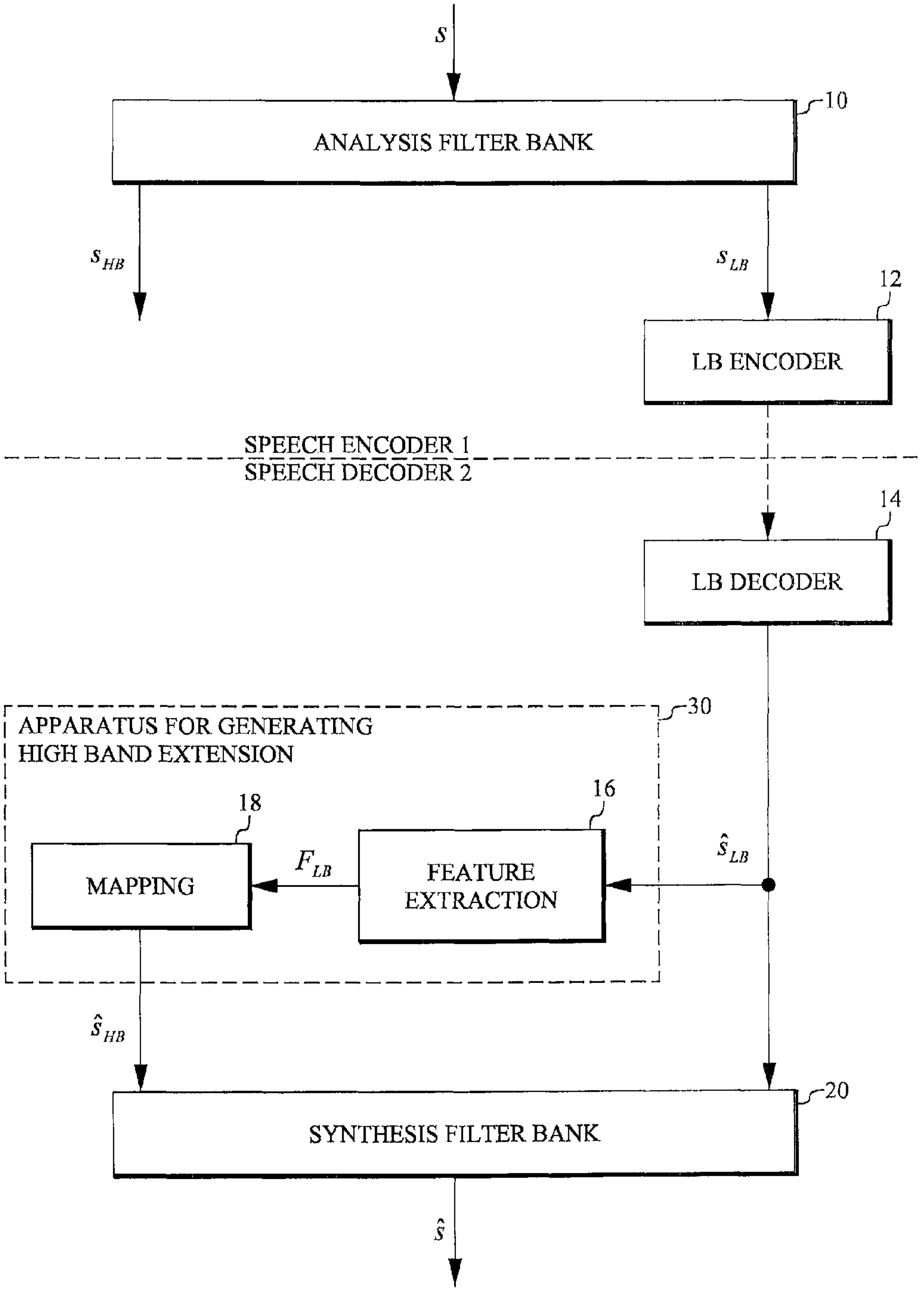
FIG. 1 is a block diagram illustrating an embodiment of a coding/decoding arrangement that includes a speech decoder in accordance with an embodiment of the present invention.

Elements having the same or similar functions will be provided with the same reference designations in the drawings.

In the following a set of LB features and their use to estimate the HB part of the signal by means of a mapping is explained. Further, it is also explained how transmitted HB information can be used to control the mapping.

FIG. 1 is a block diagram illustrating an embodiment of a coding/decoding arrangement that includes a speech decoder in accordance with an embodiment of the present invention. A speech encoder 1 receives (typically a frame of) a source audio signal s, which is forwarded to an analysis filter bank 10 that separates the audio signal into a low band part $s_{LB}$ and a high band part $s_{HB}$. In this embodiment the HB part is discarded (which means that the analysis filter bank may simply comprise a lowpass filter). The LB part $s_{LB}$ of the audio signal is encoded in an LB encoder 12 (typically a Code Excited Linear Prediction (CELP) encoder, for example an Algebraic Code Excited Linear Prediction (ACELP) encoder), and the code is sent to a speech decoder 2. An example of ACELP coding/decoding may be found in [4]. The code received by the speech decoder 2 is decoded in an LB decoder 14 (typically a CELP decoder, for example an ACELP decoder), which gives a low band audio signal $\hat{s}_{LB}$ corresponding to $s_{LB}$. This low band audio signal $\hat{s}_{LB}$ is forwarded to a feature extraction block 16 that extracts a set of features $F_{LB}$ (described below) of the signal $\hat{s}_{LB}$. The extracted features $F_{LB}$ are forwarded to a mapping block 18 that maps them to at least one high band parameter (described below) with generalized additive modeling (described below). The HB parameter(s) is used to control the envelope of a copy of the LB audio signal $\hat{s}_{LB}$ that has been frequency shifted into the high band, which gives a prediction or estimate $\hat{s}_{HB}$ of the discarded HB part $s_{HB}$. The signals $\hat{s}_{LB}$ and $\hat{s}_{HB}$ are forwarded to a synthesis filter bank 20 that reconstructs an estimate $\hat{s}$ of the original source audio signal. The feature extraction block 16 and the mapping block 18 together form an apparatus 30 (further described below) for generating the HB extension.

The exemplifying LB audio signal features, referred to as local features, presented below are used to predict certain HB signal characteristics. All features or a subset of the exemplified features may be used. All these local features are calculated on a frame by frame basis, and local feature dynamics also includes information from the previous frame. In the following n is a frame index, l is a sample index, and s(n,l) is a speech sample.

The first two example features are related to spectrum tilt and tilt dynamics. They measure the frequency distribution of the energy:

$$\Psi_1(n) = \frac{\sum_{l=1}^{L} s(n, l)s(n, l-1)}{\sum_{l=1}^{L} s^2(n, l)} \tag{1}$$

$$\Psi_2(n) = \frac{|\Psi_1(n) - \Psi_1(n-1)|}{\Psi_1(n) + \Psi_1(n-1)} \tag{2}$$

The next two example features measure pitch (speech fundamental frequency) and pitch dynamics. The search for the optimal lag is limited by $\tau_{MIN}$ and $\tau_{MAX}$ to a meaningful pitch range, e.g., 50-400 Hz:

$$\Psi_3(n) = \underset{\tau_{MIN}<\tau<\tau_{MAX}}{\operatorname{argmax}} \frac{\sum_{l=1}^{L} s(n, l)s(n, l+\tau)}{\sqrt{\sum_{l=1}^{L} s^2(n, l)\sum_{l=1}^{L} s^2(n, l+\tau)}} \tag{3}$$

$$\Psi_4(n) = \frac{|\Psi_3(n) - \Psi_3(n-1)|}{\Psi_3(n) + \Psi_3(n-1)} \tag{4}$$

Fifth and sixth example features reflect the balance between tonal and noise like components in the signal. Here $\sigma_{ACB}^2$ and $\sigma_{FCB}^2$ are the energies of the adaptive and fixed codebook in CELP codecs, for example ACELP codecs, and $\sigma_e^2$ is the energy of the excitation signal:

$$\Psi_5(n) = \frac{\sigma_{ACB}^2(n) - \sigma_{FCB}^2(n)}{\sigma_e^2(n)} \tag{5}$$

$$\Psi_6(n) = \frac{|\Psi_5(n) - \Psi_5(n-1)|}{\Psi_5(n) + \Psi_5(n-1)} \tag{6}$$

The last local feature in this example set captures energy dynamics on a frame by frame basis. Here $\sigma_s^2$ is the energy of a speech frame:

$$\Psi_7(n) = \frac{|\log_{10}(\sigma_s^2(n)) - \log_{10}(\sigma_s^2(n-1))|}{\log_{10}(\sigma_s^2(n)) + \log_{10}(\sigma_s^2(n-1))} \tag{7}$$

All these local features, which are used in the mapping, are scaled before mapping, as follows:

$$\tilde{\Psi}(n) = \frac{\Psi(n) - \Psi_{MIN}}{\Psi_{MAX} - \Psi_{MIN}} \tag{8}$$

where $\Psi_{MIN}$ and $\Psi_{MAX}$ are pre-determined constants, which correspond to the minimum and maximum value for a given feature. This gives the extracted feature set $\Psi=\{\tilde{\Psi}_1, \ldots, \tilde{\Psi}_7\}$.

Figure 2A:
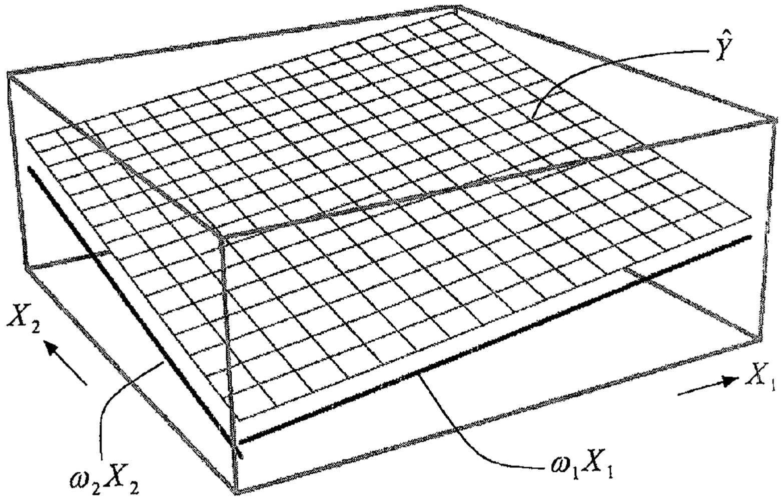
FIG. 2A-C are diagrams illustrating the principles of generalized additive models.

In accordance with the present invention the estimation of the HB extension from local features is based on generalized additive modeling. For this reason this concept will be briefly described with reference to FIG. 2A-C. Further details on generalized additive models may be found in, for example, [5].

In statistics regression models are often used to estimate the behavior of parameters. A simple model is the linear model:

$$\hat{Y} = \omega_0 + \sum_{m=1}^{M} \omega_m X_m \tag{9}$$

where $\hat{Y}$ is an estimate of a variable Y that depends on the (random) variables $X_1, \ldots, X_M$. This is illustrated for M=2 in FIG. 2A. In this case $\hat{Y}$ will be a flat surface.

A characteristic feature of the linear model is that each term in the sum depends linearly on only one variable. A generalization of this feature is to modify (at least one of) these linear functions into non-linear functions (which still each depend on only one variable). This leads to an additive model:

$$\hat{Y} = \omega_0 + \sum_{m=1}^{M} f_m(X_m) \tag{10}$$

Figure 2B:
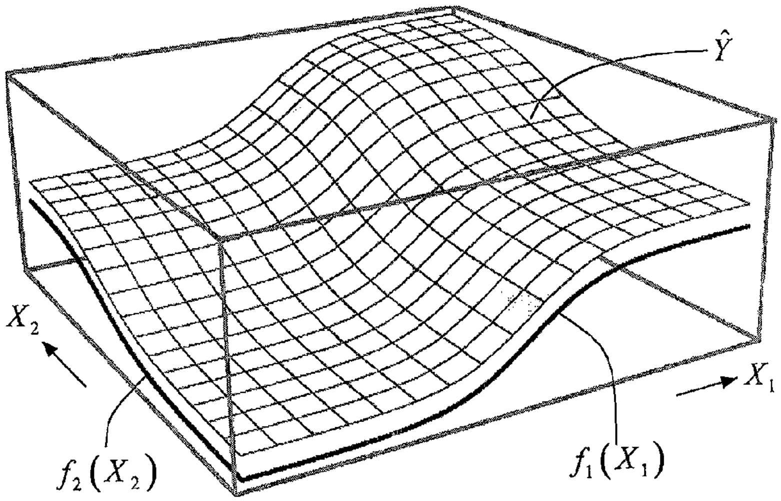

This additive model is illustrated in FIG. 2B for M=2. In this case the surface representing $\hat{Y}$ is curved. The functions $f_m$ $(X_m)$ are typically sigmoid functions (generally "S" shaped functions) as illustrated in FIG. 2B. Examples of sigmoid functions are the logistic function, the Compertz curve, the ogee curve and the hyperbolic tangent function. By varying the parameters defining the sigmoid function, the sigmoid shape can be changed continuously from an approximate linear shape between a minimum and a maximum to an approximate step function between the same minimum and a maximum.

Figure 2C:
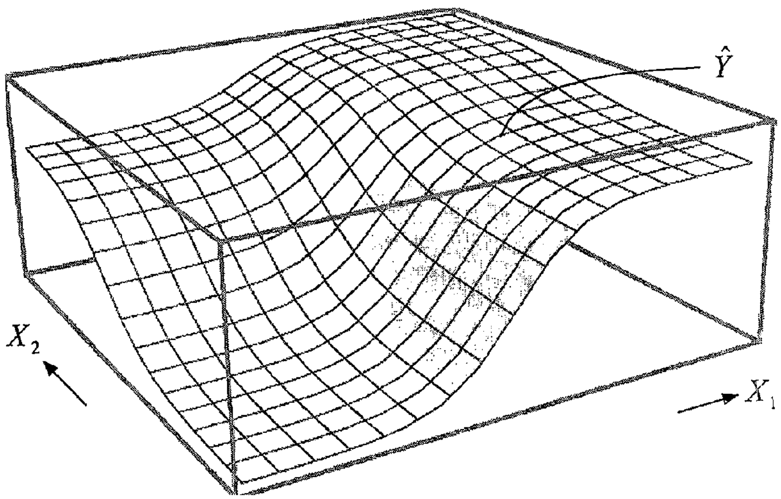

A further generalization is obtained by the generalized additive model $$g(\hat{Y}) = \omega_0 + \sum_{m=1}^{M} f_m(X_m) \tag{11}$$

where g(•) is called a link function. This is illustrated in FIG. 2C, where the surface $\hat{Y}$ is further modified ($\hat{Y}$ is obtained by taking the inverse $g^{-1}(\bullet)$, typically also a sigmoid, of both sides in equation (11)). In the special case where the link function g(•) is the identity function, equation (11) reduces to equation (10). Since both cases are of interest, for the purposes of the present invention a "generalized additive model" will also include the case of an identity link function. However, as noted above, at least one of the functions $f_m(X_m)$ is non-linear, which makes the model non-linear (the surface $\hat{Y}$ is curved).

In an embodiment of the present invention the 7 (normalized) features $\Psi=\{\tilde{\Psi}_1, \ldots, \tilde{\Psi}_7\}$ obtained in accordance with equations (1)-(8) are used to estimate the ratio Y(n) between the HB and LB energy on a compressed (perceptually motivated) domain. This ratio can correspond to certain parts of the temporal or spectral envelopes or to an overall gain, as will be further described below. An example is:

$$Y(n) = \left(\frac{E_{HB}(n)}{E_{LB}(n)}\right)^{\beta} \tag{12}$$

where β can be chosen as, e.g., β=0.2. Another example is:

$$Y(n) = \log_{10}\left(\frac{E_{HB}(n)}{E_{LB}(n)}\right) \tag{13}$$

In equations (12) and (13) the parameter β and the $\log_{10}$ function are used to transform the energy ratio to the compressed "perceptually motivated" domain. This transformation is perfat rued to account for the approximately logarithmic sensitivity characteristics of the human ear.

Since the energy $E_{HB}(n)$ is not available at the decoder, the ratio Y(n) is predicted or estimated. This is done by modeling an estimate $\hat{Y}(n)$ of Y(n) based on the extracted LB features and a generalized additive model. An example is given by:

$$\hat{Y}(n) = \omega_0 + \sum_{m=1}^{M} \left(\frac{w_{1m}}{1 + e^{-w_{2m}\tilde{\Psi}_m(n)+w_{3m}}}\right) \tag{14}$$

where M=7 with the given extracted local features (fewer features are also feasible). Comparing with equation (11) it is apparent that $\tilde{\Psi}_1, \ldots, \tilde{\Psi}_M$ correspond to the variables $X_1, \ldots, X_p$ and that the functions $f_k$ correspond to the terms in the sum, which are sigmoid functions defined by the model parameters $\omega=\{\omega_{1m},\omega_{2m},\omega_{2m}\}_{m=1}^{M}$ and the identity link function. The generalized additive model parameters $\omega_0$ and ω are stored in the decoder and have been obtained by training on a data base of speech frames. The training procedure finds suitable parameters $\omega_0$ and ω by minimizing the error between the ratio $\hat{Y}(n)$ estimated by equation (14) and the actual ratio Y(n) given by equation (12) (or (13)) over the speech data base. A suitable method (especially for sigmoid parameters) is the Levenberg-Marquardt method described in, for example, [6].

Figure 3:
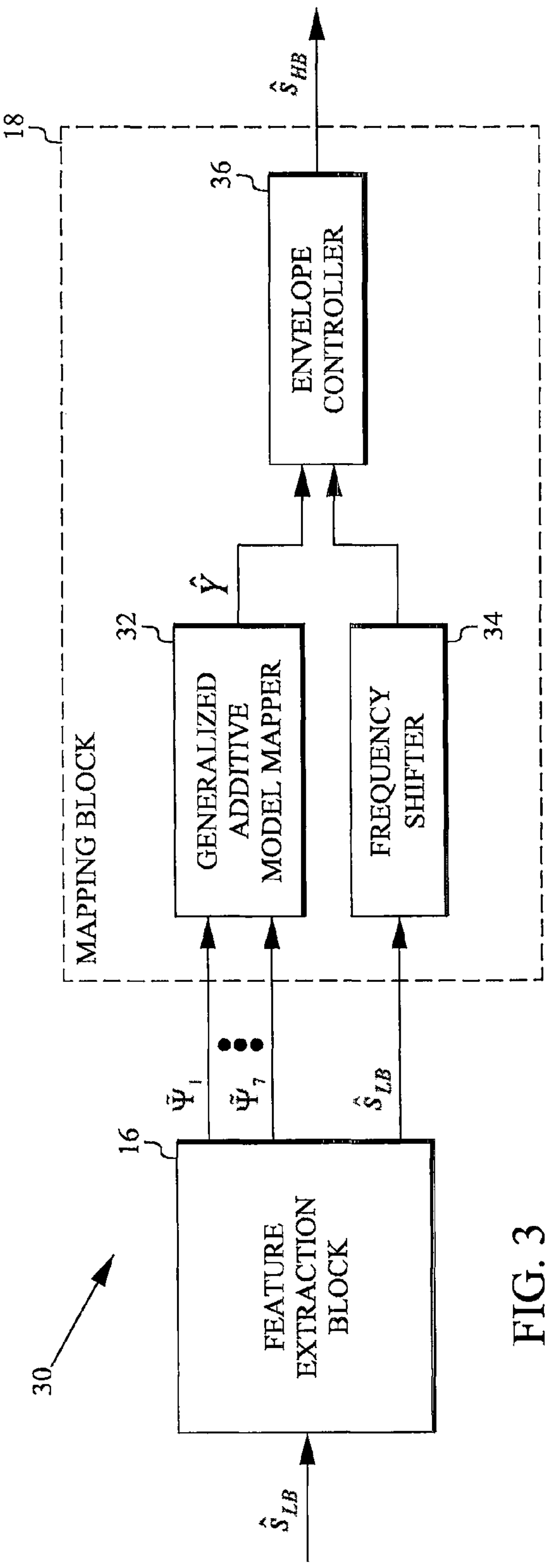
FIG. 3 is a block diagram illustrating an embodiment of an apparatus in accordance with the present invention for generating an HB extension.

FIG. 3 is a block diagram illustrating an embodiment of an apparatus 30 in accordance with the present invention for generating an HB extension. The apparatus 30 includes a feature extraction block 16 configured to extract a set of features $\tilde{Y}_1$-$\tilde{Y}_7$ of the low band audio signal. A mapping block 18, connected to the feature extraction block 16, includes a generalized additive model mapper 32 configured to map extracted features to a high band parameter $\hat{Y}$ with generalized additive modeling. In the illustrated embodiment a frequency shifter 34 configured to frequency shift a copy of the low band audio signal $\hat{s}_{LB}$ into the high band is included in the mapping block 18. In the illustrated embodiment the mapping block 18 also includes an envelope controller 36 configured to control the envelope of the frequency shifted copy by the high band parameter $\hat{Y}$.

Figure 4:
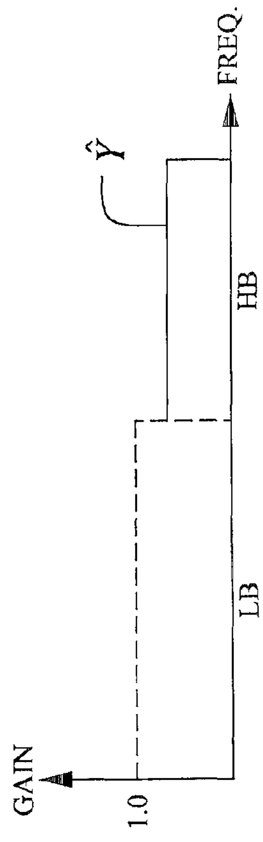
FIG. 4 is a diagram illustrating an example of a high band parameter obtained by generalized additive modeling in accordance with an embodiment of the present invention.

FIG. 4 is a diagram illustrating an example of a high band parameter obtained by generalized additive modeling in accordance with an embodiment of the present invention. It illustrates how the estimated ratio (gain) $\hat{Y}$ is used to control the envelope of the frequency shifted copy of the LB signal (in this case in the frequency domain). The dashed line represents the unaltered gain (1.0) of the LB signal. Thus, in this embodiment the HB extension is obtained by applying the single estimated gain $\hat{Y}$ to the frequency shifted copy of the LB signal.

Figure 5:
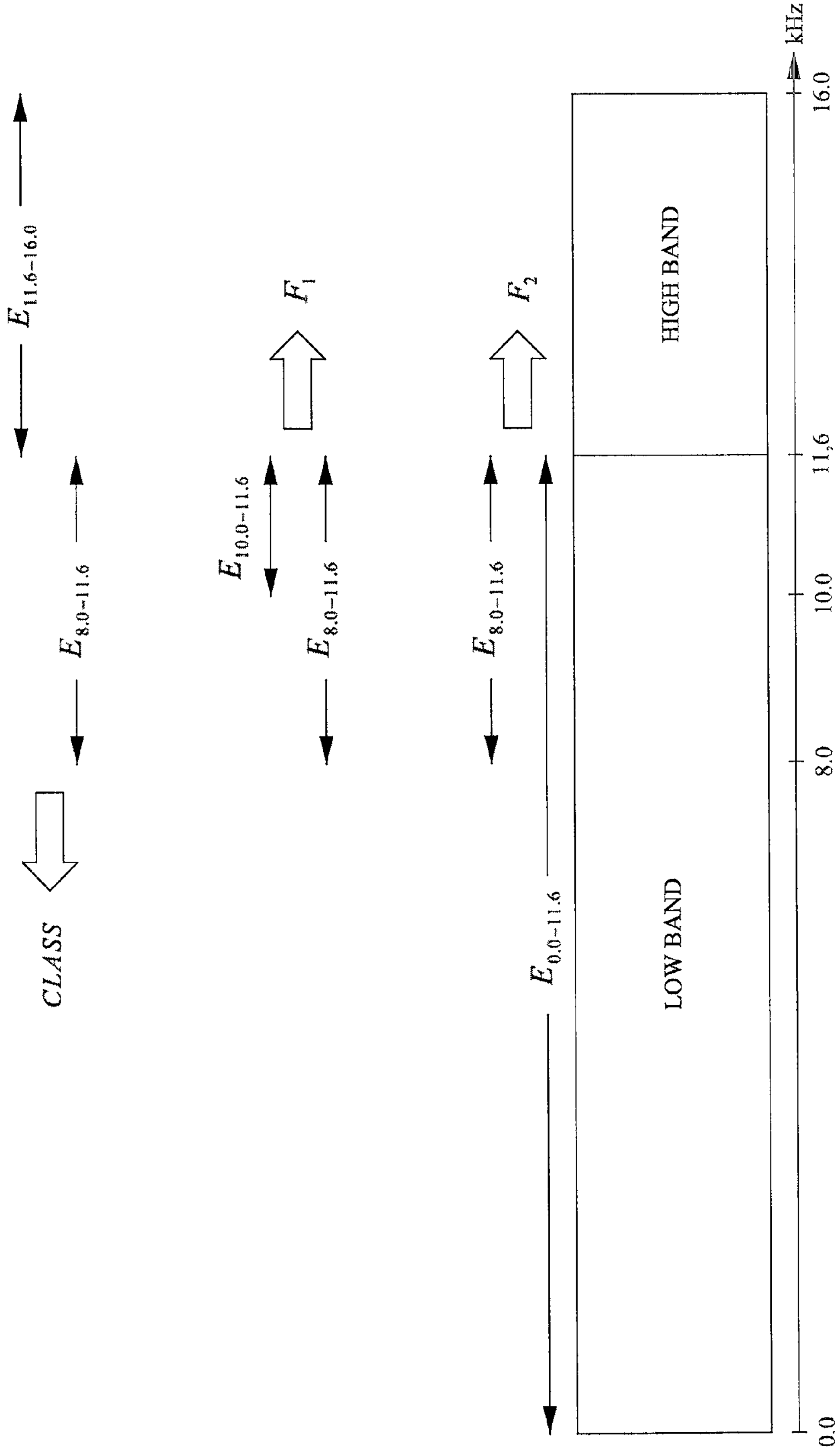
FIG. 5 is a diagram illustrating definitions of features suitable for extraction in another embodiment of the present invention.

FIG. 5 is a diagram illustrating definitions of features suitable for extraction in another embodiment of the present invention. This embodiment extracts only 2 LB signal features $F_1,F_2$.

In the embodiment illustrated in FIG. 5 the feature $F_1$ is defined by:

$$F_1 = \frac{E_{10.0-11.6}}{E_{8.0-11.6}} \tag{15}$$

where $E_{10.0-11.6}$ is an estimate of the energy of the low band audio signal in the frequency band 10.0-11.6 kHz, $E_{8.0-11.6}$ is an estimate of the energy of the low band audio signal in the frequency band 8.0-11.6 kHz.

Furthermore, in the embodiment illustrated in FIG. 5 the feature $F_2$ is defined by:

$$F_2 = \frac{E_{8.0-11.6}}{E_{0.0-11.6}} \tag{16}$$

where $E_{8.0-11.6}$ is an estimate of the energy of the low band audio signal in the frequency band 8.0-11.6 kHz, $E_{0.0-11.6}$ is an estimate of the energy of the low band audio signal in the frequency band 0.0-11.6 kHz.

The features $F_1,F_2$ represent spectrum tilt and are similar to feature $\hat{Y}_1$ above, but are determined in the frequency domain instead of the time domain. Furthermore, it is feasible to determine features $F_1,F_2$ over other frequency intervals of the LB signal. However, in this embodiment of the present invention it is essential that $F_1,F_2$ describe energy ratios between different parts of the low band audio signal spectrum.

Using the extracted features $F_1,F_2$ it is now possible the mapper 32 to map them into HB parameters $\hat{E}_k$ by using the generalized additive model:

$$\hat{E}_k = w_{0k} + \sum_{m=1}^{2} \frac{w_{1mk}}{1 + \exp(-w_{2mk}F_m + w_{3mk})} \tag{17}$$

where $\hat{E}_k$ k=1, . . . , K, are high band parameters defining gains controlling the envelope of K predetermined frequency bands of the frequency shifted copy of the low band audio signal, $\{w_{0k}, w_{1mk}, w_{2mk}, w_{3mk}\}$ are mapping coefficient sets defining the sigmoid functions for each high band parameter $\hat{E}_k$, $F_m$, m=1, 2, are features of the low band audio signal describing energy ratios between different parts of the low band audio signal spectrum.

Figure 6:
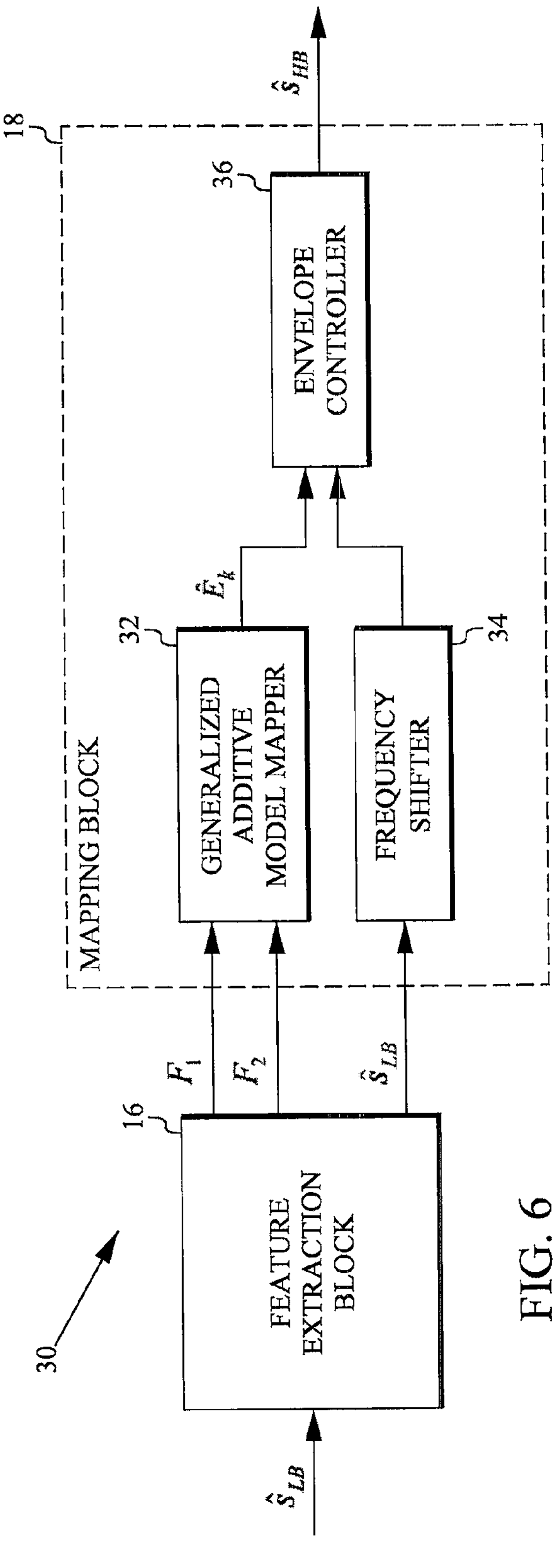
FIG. 6 is a block diagram illustrating an embodiment of an apparatus in accordance with the present invention suitable for generating an HB extension based on the features illustrated in FIG. 5.

FIG. 6 is a block diagram illustrating an embodiment of an apparatus in accordance with the present invention suitable for generating an HB extension based on the features illustrated in FIG. 5. This embodiment includes similar elements as the embodiment of FIG. 3, but in this case they are configured to map features $F_1,F_2$ into K gains $\hat{E}_k$ instead of the single gain $\hat{Y}$.

Figure 7:
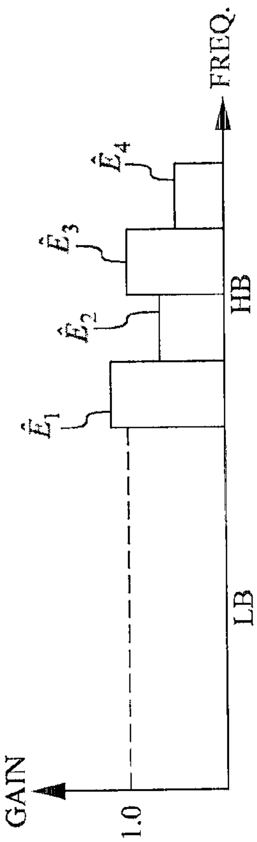
FIG. 7 is a diagram illustrating an example of high band parameters obtained by generalized additive modeling in accordance with an embodiment of the present invention based on the features illustrated in FIG. 5.

FIG. 7 is a diagram illustrating an example of high band parameters obtained by generalized additive modeling in accordance with an embodiment of the present invention based on the features illustrated in FIG. 5. In this example there are K=4 gains $\hat{E}_k$ controlling the envelope of 4 predetermined frequency bands of the frequency shifted copy of the low band audio signal. Thus, in this example the HB envelope is controlled by 4 parameters $\hat{E}_k$ instead of the single parameter $\hat{Y}$ of the example referring to FIG. 4. Fewer and more parameters are also feasible.

Figure 8:
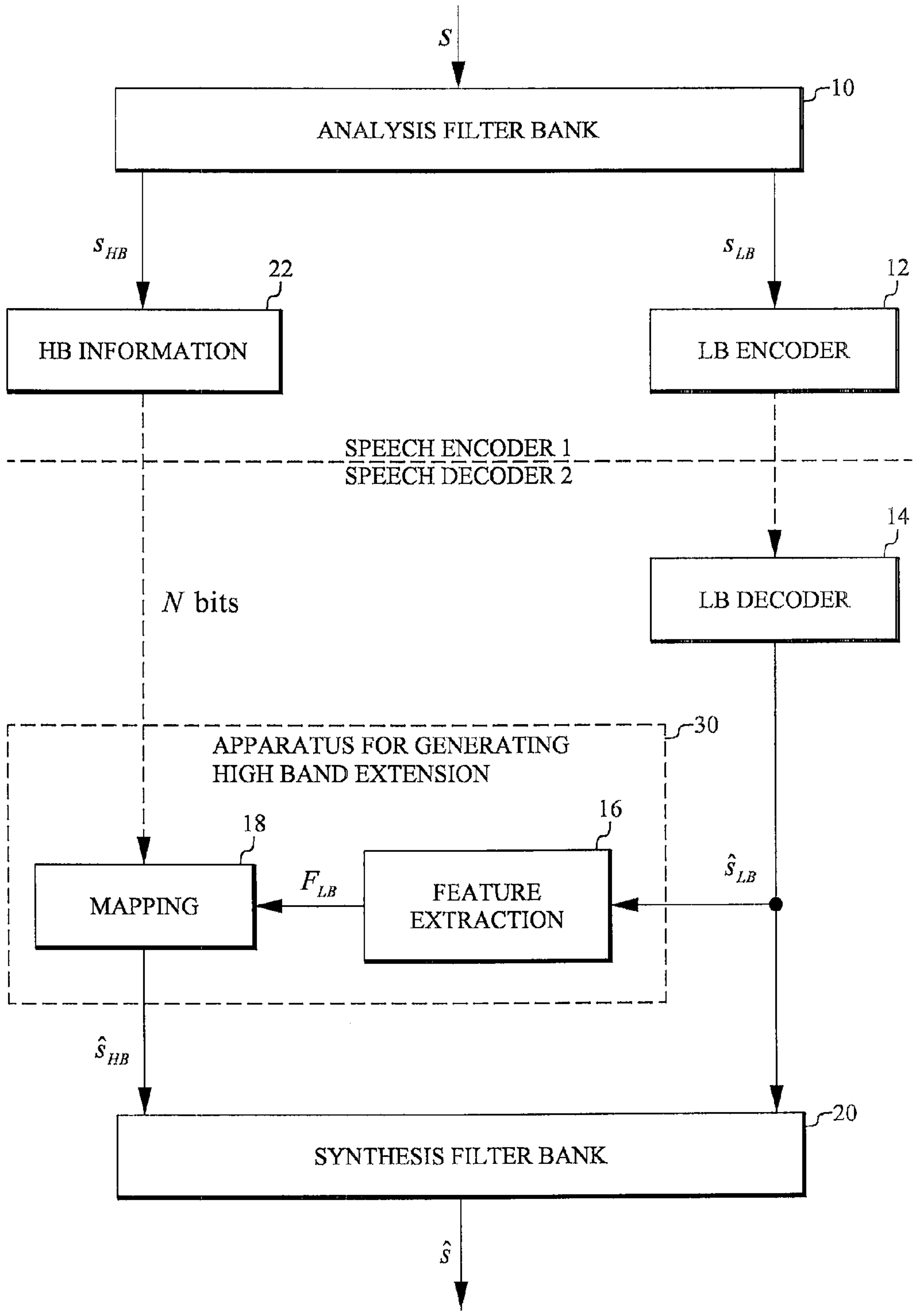
FIG. 8 is a block diagram illustrating another embodiment of a coding/decoding arrangement that includes a speech decoder in accordance with another embodiment of the present invention.

FIG. 8 is a block diagram illustrating another embodiment of a coding/decoding arrangement that includes a decoder in accordance with another embodiment of the present invention. This embodiment differs from the embodiment of FIG. 1 by not discarding the HB signal $s_{HB}$. Instead the HB signal is forwarded to an HB information block 22 that classifies the HB signal and sends an N bit class index to the speech decoder 2. If transmission of HB information is allowed, as illustrated in FIG. 8, the mapping becomes piecewise with clusters provided by the transmission, wherein the number of classes is dependent on the amount of available bits. The class index is used by mapping block 18, as will be described below.

Figure 9:
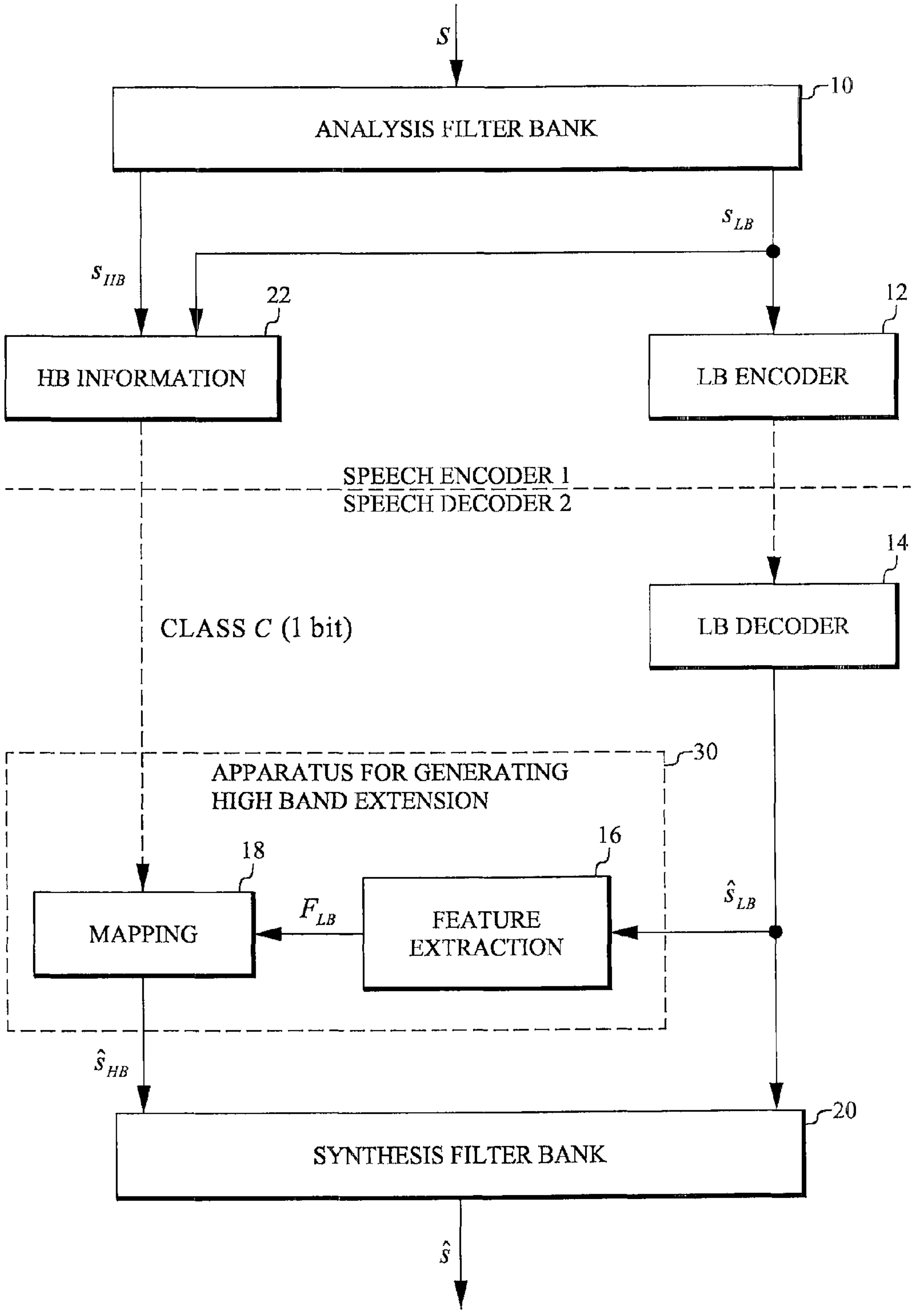
FIG. 9 is a block diagram illustrating a further embodiment of a coding/decoding arrangement that includes a speech decoder in accordance with a further embodiment of the present invention.

FIG. 9 is a block diagram illustrating a further embodiment of a coding/decoding arrangement that includes a decoder in accordance with a further embodiment of the present invention. This embodiment is similar to the embodiment of FIG. 8, but forms the class index using both the HB signal $s_{HB}$ as well as the LB signal $s_{LB}$. In this example N=1 bit, but it is also possible to have more than 2 classes by including more bits.

Figure 10:
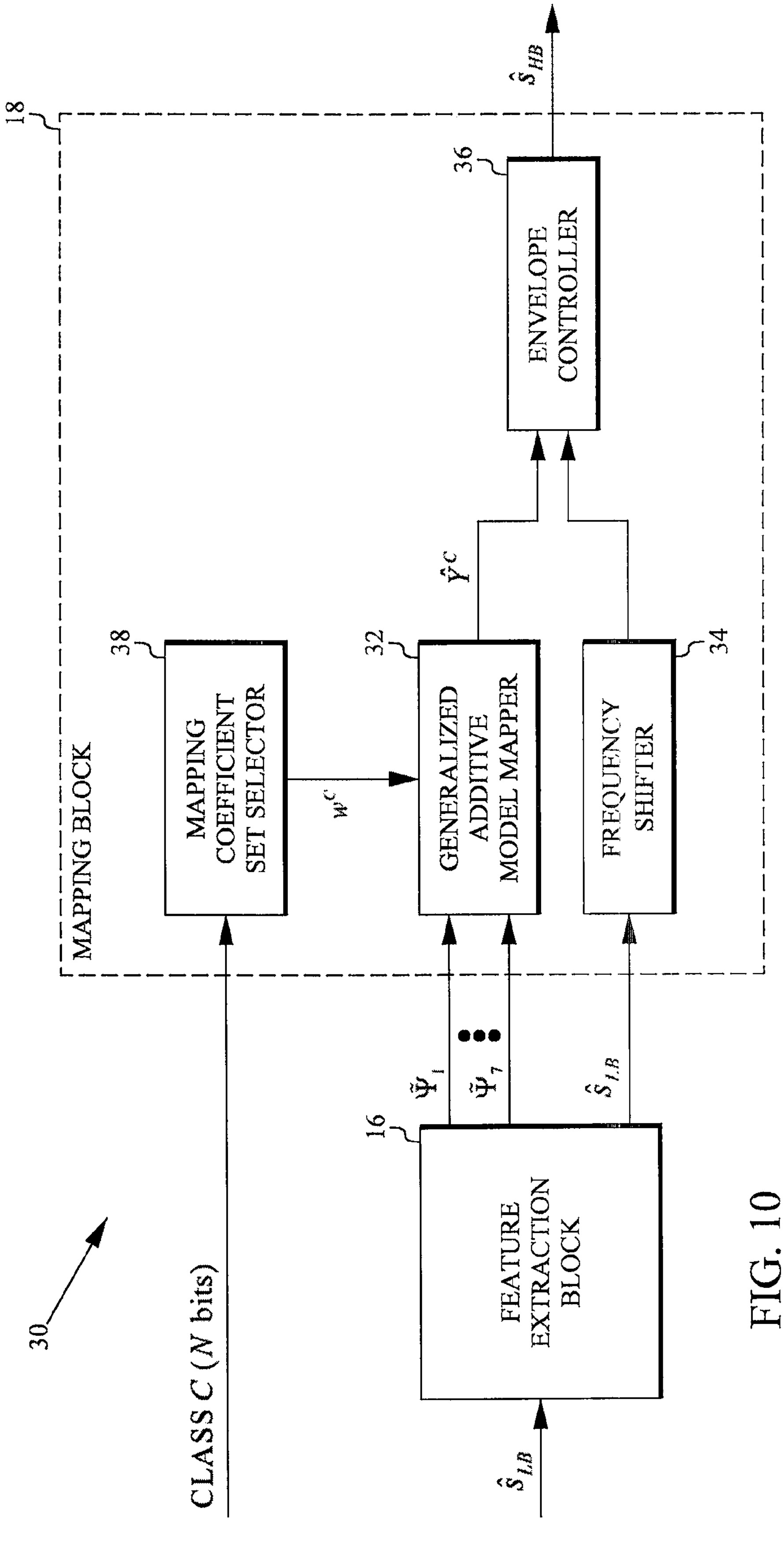
FIG. 10 is a block diagram illustrating another embodiment of an apparatus in accordance with the present invention for generating an HB extension.

FIG. 10 is a block diagram illustrating another embodiment of an apparatus in accordance with the present invention for generating an HB extension. This embodiment differs from the embodiment of FIG. 3 in that it includes a mapping coefficient selector 38, which is configured to select a mapping coefficient set $\omega^C=\{w_{0k}^C, w_{1mk}^C, w_{2mk}^C, w_{3mk}^C\}$ depending on a received signal class index C. In this embodiment the high band parameter $\hat{Y}$ is predicted from a set of low-band features $\Psi$, and pre-stored mapping coefficients $\omega^C$. The class index C selects a set of mapping coefficients, which are determined by a training procedure offline to fit the data in that cluster. One can see that as a smooth transition from a state where the HB is purely predicted (no classification) to a state where the HB is purely quantized (with classification). The latter is a result of the fact that with an increasing number of clusters, the mapping will tend to predict the mean of the cluster.

Figure 11:
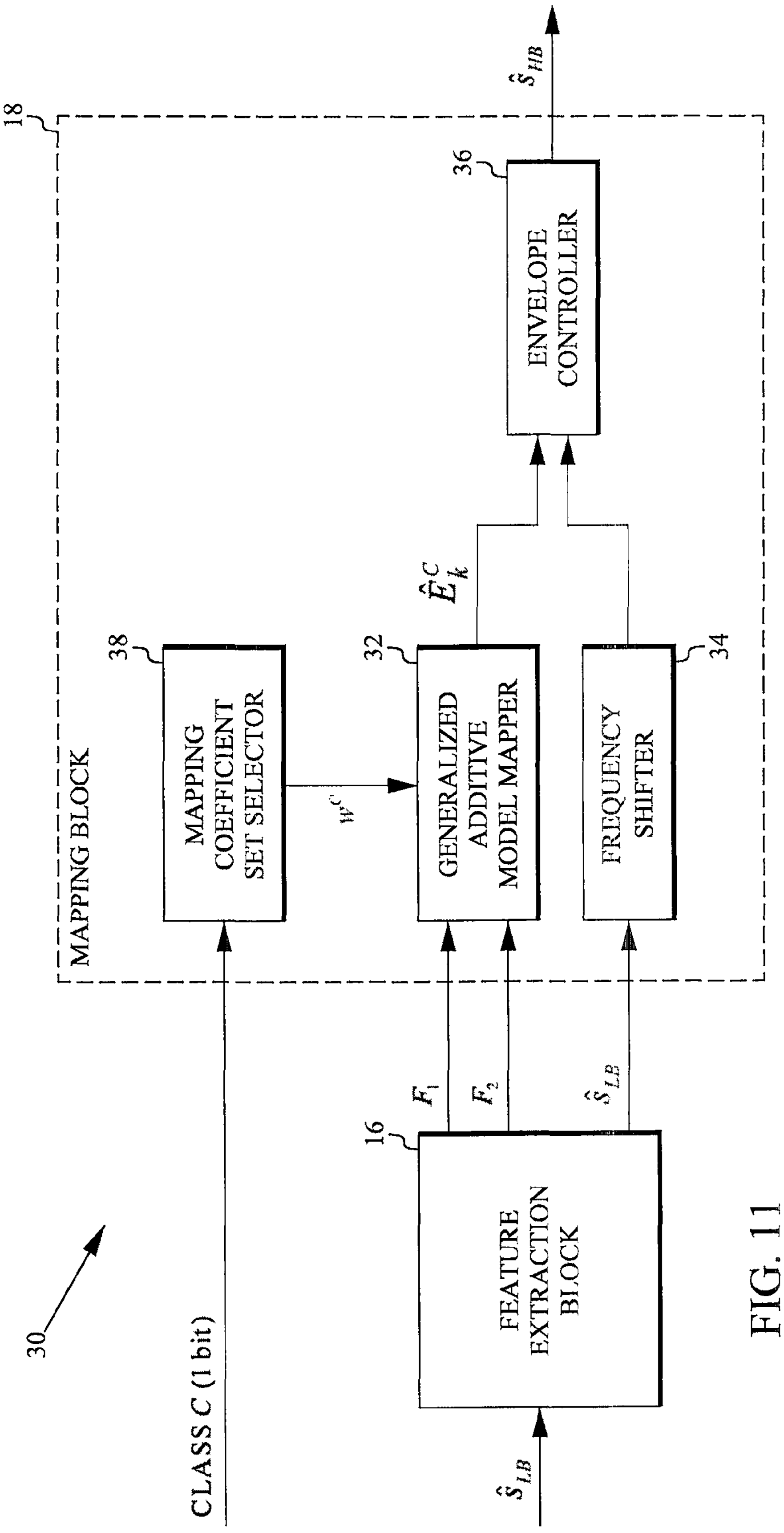
FIG. 11 is a block diagram illustrating a further embodiment of an apparatus in accordance with the present invention for generating an HB extension.

FIG. 11 is a block diagram illustrating a further embodiment of an apparatus in accordance with the present invention for generating an HB extension. This embodiment is similar to the embodiment of FIG. 10, but is based on the features $F_1,F_2$ described with reference to FIG. 5. Furthermore, in this embodiment the signal class C is given by (also refer to the upper part of FIG. 5):

$$C = \begin{cases} \text{Class 1} & \text{if } \frac{E^S_{11.6-16.0}}{E^S_{8.0-11.6}} \leq 1 \\ \text{Class 2} & \text{otherwise} \end{cases} \tag{18}$$

where $E_{8.0-11.6}^S$ is an estimate of the energy of the source audio signal in the frequency band 8.0-11.6 kHz, and $E_{11.6\text{-}16.0}^S$ is an estimate of the energy of the source audio signal in the frequency band 11.6-16.0 kHz.

In this example, C classifies (roughly speaking, to give a mental picture of what this example classification means) the sound into "voiced" (Class 1) and "unvoiced" (Class 2).

Based on this classification, the mapping block 18 may be configured to perform the mapping in accordance with (generalized additive model 32):

$$\hat{E}_k^C = w_{0k}^C + \sum_{m=1}^{2} \frac{w_{1mk}^C}{1 + \exp(-w_{2mk}^C F_m + w_{3mk}^C)}$$

where $\hat{E}_k^C$, k=1, . . . , K, are high band parameters defining gains associated with a signal class C, which classifies a source audio signal represented by the low band audio signal ($\hat{s}_{LB}$), and controlling the envelope of K predetermined frequency bands of the frequency shifted copy of the low band audio signal, $\{w_{0k}^C, w_{1mk}^C, w_{2mk}^C, w_{3mk}^C\}$ are mapping coefficient sets defining the sigmoid functions for each high band parameter $\hat{E}_k$ in signal class C, $F_m$, m=1, 2, are features of the low band audio signal describing energy ratios between different parts of the low band audio signal spectrum.

As an example K=4 and $F_1$,$F_2$ may be defined by (15) and (16).

An advantage of the embodiments of FIG. 8-11 is that they enable a "fine tuning" of the mapping of the extracted features to the type of encoded sound.

Figure 12:
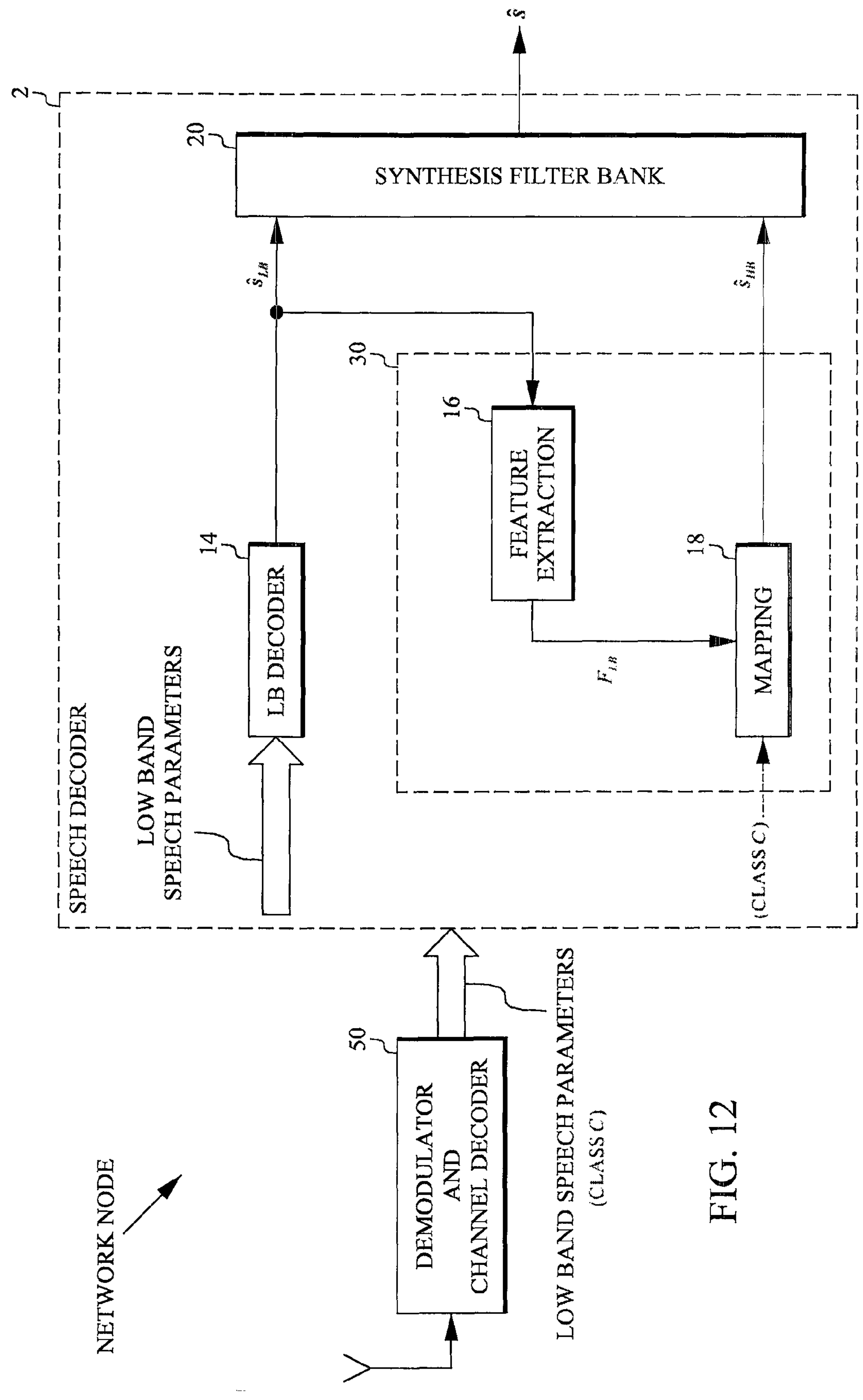
FIG. 12 is a block diagram illustrating an embodiment of a network node including an embodiment of a speech decoder in accordance with the present invention.

FIG. 12 is a block diagram illustrating an embodiment of a network node including an embodiment of a speech decoder 2 in accordance with the present invention. This embodiment illustrates a radio terminal, but other network nodes are also feasible. For example, if voice over IP (Internet Protocol) is used in the network, the nodes may comprise computers.

In the network node in FIG. 12 an antenna receives a coded speech signal. A demodulator and channel decoder 50 transforms this signal into low band speech parameters (and optionally the signal class C, as indicated by "(Class C)" and the dashed signal line) and forwards them to the speech decoder 2 for generating the speech signal $\hat{s}$, as described with reference to the various embodiments above.

The steps, functions, procedures and/or blocks described herein may be implemented in hardware using any conventional technology, such as discrete circuit or integrated circuit technology, including both general-purpose electronic circuitry and application-specific circuitry.

Alternatively, at least some of the steps, functions, procedures and/or blocks described herein may be implemented in software for execution by a suitable processing device, such as a micro processor, Digital Signal Processor (DSP) and/or any suitable programmable logic device, such as a Field Programmable Gate Array (FPGA) device.

It should also be understood that it may be possible to reuse the general processing capabilities of the network nodes. This may, for example, be done by reprogramming of the existing software or by adding new software components.

Figure 13:
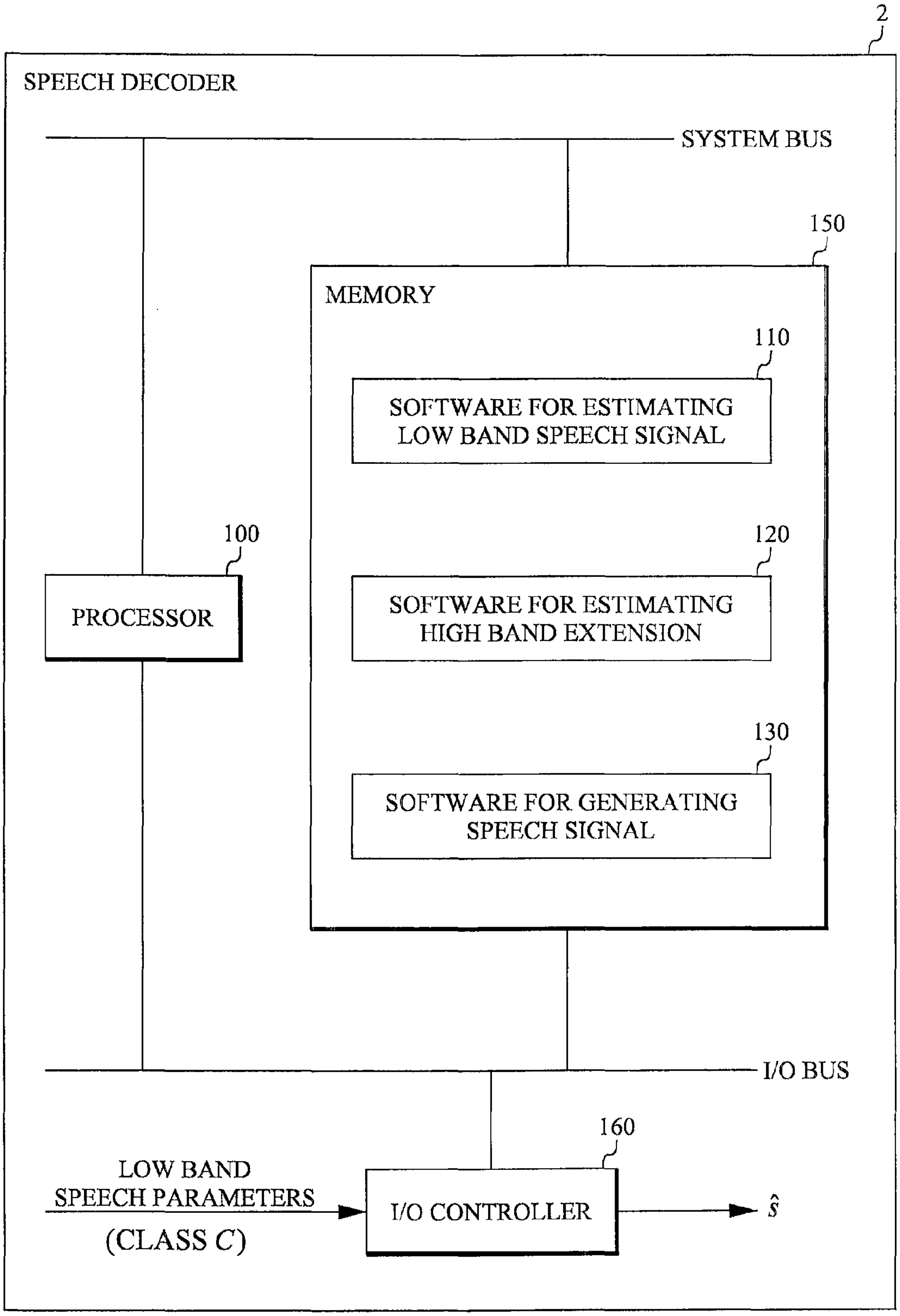
FIG. 13 is a block diagram illustrating an embodiment of a speech decoder in accordance with the present invention.

As an implementation example, FIG. 13 is a block diagram illustrating an example embodiment of a speech decoder 2 in accordance with the present invention. This embodiment is based on a processor 100, for example a micro processor, which executes a software component 110 for estimating the low band speech signal $\hat{s}_{LB}$, a software component 120 for estimating the high band speech signal $\hat{s}_{HB}$, and a software component 130 for generating the speech signal $\hat{s}$ from $\hat{s}_{LB}$ and $\hat{s}_{HB}$. This software is stored in memory 150. The processor 100 communicates with the memory over a system bus. The low band speech parameters (and optionally the signal class C) are received by an input/output (I/O) controller 160 controlling an I/O bus, to which the processor 100 and the memory 150 are connected. In this embodiment the parameters received by the I/O controller 150 are stored in the memory 150, where they are processed by the software components. Software component 110 may implement the functionality of block 14 in the embodiments described above. Software component 120 may implement the functionality of block 30 in the embodiments described above. Software component 130 may implement the functionality of block 20 in the embodiments described above. The speech signal obtained from software component 130 is outputted from the memory 150 by the I/O controller 160 over the I/O bus.

In the embodiment of FIG. 13 the speech parameters are received by I/O controller 160, and other tasks, such as demodulation and channel decoding in a radio terminal, are assumed to be handled elsewhere in the receiving network node. However, an alternative is to let further software components in the memory 150 also handle all or part of the digital signal processing for extracting the speech parameters from the received signal. In such an embodiment the speech parameters may be retrieved directly from the memory 150.

In case the receiving network node is a computer receiving voice over IP packets, the IP packets are typically forwarded to the I/O controller 160 and the speech parameters are extracted by further software components in the memory 150.

Some or all of the software components described above may be carried on a computer-readable medium, for example a CD, DVD or hard disk, and loaded into the memory for execution by the processor.

Figure 14:
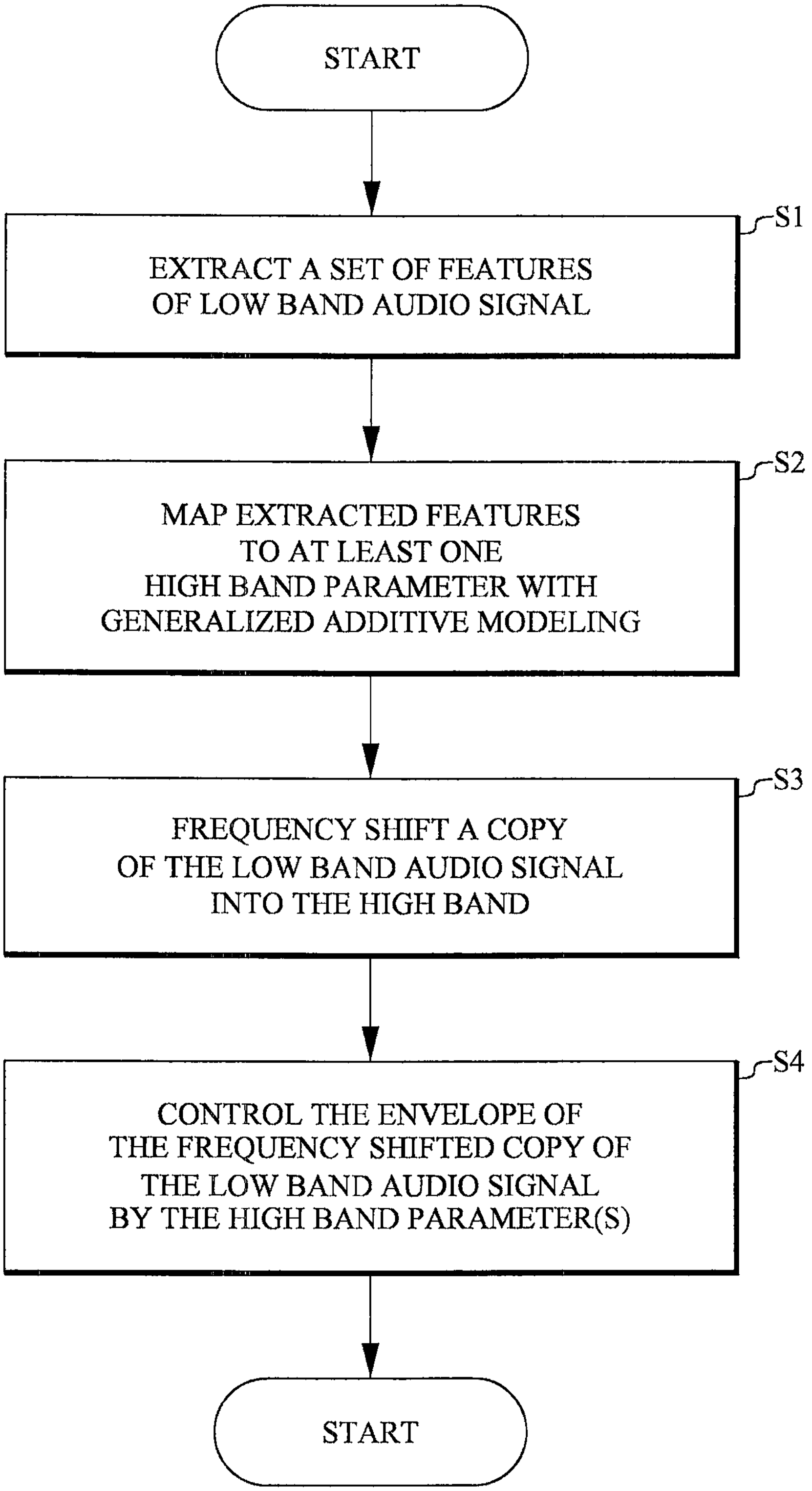
FIG. 14 is a flow chart illustrating an embodiment of the method in accordance with the present invention.

FIG. 14 is a flow chart illustrating an embodiment of the method in accordance with the present invention. Step S1 extracts a set of features ($F_{LB}$, $\tilde{\Psi}_1$-$\tilde{\Psi}_7$, $F_1$,$F_2$) of the low band audio signal. Step S2 maps extracted features to at least one high band parameter ($\hat{Y},\hat{Y}^C,\hat{E}_k,\hat{E}_k^C$) with generalized additive modeling. Step S3 frequency shifts a copy of the low band audio signal $\hat{s}_{LB}$ into the high band. Step S4 controls the envelope of the frequency shifted copy of the low band audio signal by the high band parameter(s).

It will be understood by those skilled in the art that various modifications and changes may be made to the present invention without departure from the scope thereof, which is defined by the appended claims.

ABBREVIATIONS

ACELP Algebraic Code Excited Linear Prediction
BWE BandWidth Extension
CELP Code Excited Linear Prediction
DSP Digital Signal Processor
FPGA Field Programmable Gate Array
GMM Gaussian Mixture Models
HB High Band
HMM Hidden Markov Models
IP Internet Protocol
LB Low Band

REFERENCES

[1] M. Nilsson and W. B. Kleijn, "Avoiding over-estimation in bandwidth extension of telephony speech", Proc. IEEE Int. Conf. Acoust. Speech Sign. Process., 2001.

[2] P. Jax and P. Vary, "Wideband extension of telephone speech using a hidden Markov model", IEEE Workshop on Speech Coding, 2000.

[3] ITU-T Rec. G.729.1, "G.729-based embedded variable bit-rate coder: An 8-32 kbit/s scalable wideband coder bitstream interoperable with G.729", 2006.

[4] 3GPP TS 26.190, "Adaptive Multi-Rate-Wideband (AMR-WB) speech codec; Transcoding functions", 2008.

[5] "New Approaches to Regression by Generalized Additive Models and Continuous Optimization for Modern Applications in Finance, Science and Technology", Pakize Taylan, Gerhard-Wilhelm Weber, Amir Beck, http://www3.iam.metu.edu.tr/iam/images/1/10/Preprint56.pdf

[6] Numerical Recipes in C++: The Art of Scientific Computing, 2nd edition, reprinted 2003, W. Press, S. Teukolsky, W. Vetterling, B. Flannery

The invention claimed is:

1. A method by an apparatus for estimating a high band extension of a low band audio signal, the method comprising:

extracting a set of features of the low band audio signal;

mapping the extracted set of features of the low band audio signal to at least one high band parameter using generalized additive modeling, wherein the mapping is performed responsive to a sum of sigmoid functions of the extracted set of features of the low band audio signal;

frequency shifting a copy of the low band audio signal into the high band; and controlling an envelope of the frequency shifted copy of the low band audio signal in response to the at least one high band parameter.

2. The method of claim 1, wherein the mapping is performed in response to the following equation:

$$\hat{E}_k = w_{0k} + \sum_{m=1}^{2} \frac{w_{1mk}}{1 + \exp(-w_{2mk} F_m + w_{3mk})}$$

where $\hat{E}_k$, k=1, . . . , K, are high band parameters defining gains controlling the envelope of K predetermined frequency bands of the frequency shifted copy of the low band audio signal, $\{w_{0k}, w_{1mk}, w_{2mk}, w_{3mk}\}$ are mapping coefficient sets defining the sigmoid functions for each high band parameter $\hat{E}_k$, $F_m$, m=1,2, are features of the low band audio signal describing energy ratios between different parts of the low band audio signal spectrum.

3. The method of claim 2, wherein the feature $F_1$ is determined in response to the following equation:

$$F_1 = \frac{E_{10.0-11.6}}{E_{8.0-11.6}}$$

where $E_{10.0-11.6}$ is an estimate of the energy of the low band audio signal in the frequency band 10.0-11.6 kHz, $E_{8.0-11.6}$ is an estimate of the energy of the low band audio signal in the frequency band 8.0-11.6 kHz.

4. The method of claim 2, wherein the feature $F_2$ is determined in response to the following equation:

$$F_2 = \frac{E_{8.0-11.6}}{E_{0.0-11.6}}$$

where $E_{8.0-11.6}$ is an estimate of the energy of the low band audio signal in the frequency band 8.0-11.6 kHz, $E_{0.0-11.6}$ is an estimate of the energy of the low band audio signal in the frequency band 0.0-11.6 kHz.

5. The method of claim 2, wherein K=4.

6. The method of claim 1, wherein the mapping is performed in response to the following equation:

$$\hat{E}_k^C = w_{0k}^C + \sum_{m=1}^{2} \frac{w_{1mk}^C}{1 + \exp(-w_{2mk}^C F_m + w_{3mk}^C)}$$

where $\hat{E}_k^C$, k=1, . . . , K, are high band parameters defining gains associated with a signal class C which classifies a source audio signal represented by the low band audio signal ($\hat{s}_{LB}$), and controlling the envelope of K predetermined frequency bands of the frequency shifted copy of the low band audio signal, $\{w_{0k}^C, w_{1mk}^C, w_{2mk}^C, w_{3mk}^C\}$ are mapping coefficient sets defining the sigmoid functions for each high band parameter $\hat{E}_k$ in signal class C, $F_m$, m=1,2, are features of the low band audio signal describing energy ratios between different parts of the low band audio signal spectrum.

7. The method of claim 6, further comprising the step of selecting a mapping coefficient set $\{w_{0k}, w_{1mk}, w_{2mk}, w_{3mk}\}$ corresponding to signal class C, where C is determined in response to the following equation:

$$C = \begin{cases} \text{Class 1} & \text{if } \dfrac{E_{11.6-16.0}^S}{E_{8.0-11.6}^S} \le 1 \\ \text{Class 2} & \text{otherwise} \end{cases}$$

where $E_{8.0-11.6}^S$ is an estimate of the energy of the source audio signal in the frequency band 8.0-11.6 kHz, and $E_{11.6-16.0}^S$ is an estimate of the energy of the source audio signal in the frequency band 11.6-16.0 kHz.

8. An apparatus for estimating a high band extension ($\hat{s}_{HB}$) of a low band audio signal ($\hat{s}_{LB}$), the apparatus comprising:

a feature extraction block configured to extract a set of features of the low band audio signal; and a mapping block that comprises:

a generalized additive model mapper configured to map the extracted set of features of the low band audio signal to at least one high band parameter using generalized additive modeling, wherein the generalized additive model mapper is configured to perform the mapping responsive to a sum of sigmoid functions of the extracted features set of features of the low band audio signal;

a frequency shifter configured to frequency shift a copy of the low band audio signal into the high band; and an envelope controller configured to control an envelope of the frequency shifted copy in response to the at least one high band parameter.

9. The apparatus of claim 8, wherein the generalized additive model mapper is configured to perform the mapping in response to the following equation:

$$\hat{E}_k = w_{0k} + \sum_{m=1}^{2} \frac{w_{1mk}}{1+\exp(-w_{2mk}F_m + w_{3mk})}$$

where $\hat{E}_k$, k=1, . . . , K, are high band parameters defining gains controlling the envelope of K predetermined frequency bands of the frequency shifted copy of the low band audio signal, $\{w_{0k}, w_{1mk}, w_{2mk}, w_{3mk}\}$ are mapping coefficient sets defining the sigmoid functions for each high band parameter $\hat{E}_k$, $F_m$, m=1,2, are features of the low band audio signal describing energy ratios between different parts of the low band audio signal spectrum.

10. The apparatus of claim 9, wherein the feature extraction block is configured to extract a feature $F_1$ determined in response to the following equation:

$$F_1 = \frac{E_{10.0-11.6}}{E_{8.0-11.6}}$$

where $E_{10.0-11.6}$ is an estimate of the energy of the low band audio signal in the frequency band 10.0-11.6 kHz, $E_{8.0-11.6}$ is an estimate of the energy of the low band audio signal in the frequency band 8.0-11.6 kHz.

11. The apparatus of claim 9, wherein the feature extraction block is configured to extract a feature $F_2$ determined in response to the following equation:

$$F_2 = \frac{E_{8.0-11.6}}{E_{0.0-11.6}}$$

where $E_{8.0-11.6}$ is an estimate of the energy of the low band audio signal in the frequency band 8.0-11.6 kHz, $E_{0.0-11.6}$ is an estimate of the energy of the low band audio signal in the frequency band 0.0-11.6 kHz.

12. The apparatus of claim 9, wherein the generalized additive model mapper is configured to map extracted features to K=4 high band parameter.

13. The apparatus of claim 8, wherein the generalized additive model mapper is configured to perform the mapping in response to the following equation:

$$\hat{E}_k^C = w_{0k}^C + \sum_{m=1}^{2} \frac{w_{1mk}^C}{1+\exp(-w_{2mk}^C F_m + w_{3mk}^C)}$$

where $\hat{E}_k^C$, k=1, . . . , K, are high band parameters defining gains associated with a signal class C, which classifies a source audio signal represented by the low band audio signal ($\hat{s}_{LB}$), and controlling the envelope of K predetermined frequency bands of the frequency shifted copy of the low band audio signal, $\{w_{0k}^C, w_{1mk}^C, w_{2mk}^C, w_{3mk}^C\}$ are mapping coefficient sets defining the sigmoid functions for each high band parameter $\hat{E}_k$ in signal class C, $F_m$, m=1,2, are features of the low band audio signal describing energy ratios between different parts of the low band audio signal spectrum.

14. The apparatus of claim 13 further comprising a mapping coefficient set selector configured to select a mapping coefficient set $\{w_{0mk}^C, w_{1mk}^C, w_{2mk}^C, w_{3mk}^C\}$ corresponding to signal class C, where C is determined in response to the following equation:

$$C = \begin{cases} \text{Class 1} & \text{if } \frac{E_{11.6-16.0}^S}{E_{8.0-11.6}^S} \le 1 \\ \text{Class 2} & \text{otherwise} \end{cases}$$

where $E_{8.0-11.6}^S$ is an estimate of the energy of the source audio signal in the frequency band 8.0-11.6 kHz, and $E_{11.6-16.0}^S$ is an estimate of the energy of the source audio signal in the frequency band 11.6-16.0 kHz.

15. A speech decoder including the apparatus configured to operate in accordance with claim 8.

16. A network node including the speech decoder configured to operate in accordance with claim 15.

17. The network node of claim 16, wherein the network node is a radio terminal.

* * * * *

UNITED STATES PATENT AND TRADEMARK OFFICE

CERTIFICATE OF CORRECTION

PATENT NO. : 8,929,568 B2
APPLICATION NO. : 13/509859
DATED : January 6, 2015
INVENTOR(S) : Grancharov et al.

It is certified that error appears in the above-identified patent and that said Letters Patent is hereby corrected as shown below:

In the Specification

In Column 5, Line 39, delete "Compertz" and insert -- Gompertz --, therefor.

In Column 6, Line 52, delete "$\tilde{Y}_1$-$\tilde{Y}_7$" and insert -- $\Psi_1$-$\Psi_7$ --, therefor.

In Column 10, Line 9, delete "controller 150" and insert -- controller 160 --, therefor.

In the Claims

In Column 12, Line 35, in Claim 7, delete "$\{w_{0k}, w_{1mk}, w_{2mk}, w_{3mk}\}$" and insert -- $\{w_{0k}^c, w_{1mk}^c, w_{2mk}^c, w_{3mk}^c\}$ --, therefor.

Signed and Sealed this
Fourth Day of August, 2015

Michelle K. Lee
*Director of the United States Patent and Trademark Office*